United States Patent
Yuan et al.

(10) Patent No.: US 9,755,599 B2
(45) Date of Patent: Sep. 5, 2017

(54) AMPLIFIER WITH BOOSTED PEAKING

(71) Applicant: QUALCOMM Incorporated, San Diego, CA (US)

(72) Inventors: Xiaobin Yuan, Carmel, NY (US); Mangal Prasad, Apex, NC (US); Joseph Natonio, Wappingers Falls, NY (US)

(73) Assignee: QUALCOMM Incorporated, San Diego, CA (US)

( * ) Notice: Subject to any disclaimer, the term of this patent is extended or adjusted under 35 U.S.C. 154(b) by 55 days.

(21) Appl. No.: 14/857,802

(22) Filed: Sep. 17, 2015

(65) Prior Publication Data

US 2017/0085239 A1    Mar. 23, 2017

(51) Int. Cl.
  *H03F 3/191*    (2006.01)
  *H03G 3/30*    (2006.01)
  *H03F 3/193*    (2006.01)
  *H03F 3/45*    (2006.01)
  *H03H 11/48*    (2006.01)
  *H04B 3/04*    (2006.01)
  *H04L 25/03*    (2006.01)

(52) U.S. Cl.
  CPC ........... *H03G 3/3036* (2013.01); *H03F 3/193* (2013.01); *H03F 3/45197* (2013.01); *H03H 11/48* (2013.01); *H04B 3/04* (2013.01); *H04L 25/03878* (2013.01); *H03F 3/191* (2013.01); *H03F 2200/129* (2013.01); *H03F 2200/372* (2013.01); *H03F 2200/451* (2013.01); *H03F 2203/45631* (2013.01); *H03F 2203/45644* (2013.01); *H03F 2203/45686* (2013.01); *H03F 2203/45726* (2013.01)

(58) Field of Classification Search
  CPC ...... H03G 3/3036; H03G 3/00; H03G 1/0088; H03G 1/0035; H03F 3/193; H03F 3/45; H03F 2003/45008; H03F 2200/177; H03F 3/45192; H03F 3/191; H03F 2200/546; H03F 2200/372
  USPC .......................... 330/253, 254, 283, 305, 308
  See application file for complete search history.

(56) References Cited

U.S. PATENT DOCUMENTS

| | | | |
|---|---|---|---|
| 6,542,540 B1 | 4/2003 | Leung et al. | |
| 7,019,592 B2 * | 3/2006 | Jaussi | H03F 3/45183 330/253 |
| 7,391,829 B2 | 6/2008 | Tripathi et al. | |
| 7,880,568 B2 | 2/2011 | Amin et al. | |

(Continued)

OTHER PUBLICATIONS

Allidina K et al., "A Widely Tunable Active RF Filter Topology", 2006 IEEE International Symposium on Circuits and Systems May 21-24, 2006 Island of Kos, Greece, IEEE—Piscataway, NJ, USA, May 21, 2006 (May 21, 2006 ), p. 4pp, XP032457849, DOI: 10.11 09/ISCAS.2006.1692726 ISBN: 978-0-7803-9389-9.

(Continued)

*Primary Examiner* — Khanh V Nguyen
(74) *Attorney, Agent, or Firm* — Loza & Loza, LLP/Qualcomm

(57) ABSTRACT

In one implementation, an amplifier comprises a load circuit comprising a plurality of inductor cells, and a drive circuit configured to receive an input signal, and to drive the load circuit based on the input signal to generate an amplified signal. The amplifier also comprises a controller configured to tune a peaking gain of the amplifier by adjusting a number of the inductor cells that are enabled.

26 Claims, 13 Drawing Sheets

(56) References Cited

U.S. PATENT DOCUMENTS

| | | | |
|---|---|---|---|
| 7,894,515 B2 | 2/2011 | Kuijk et al. | |
| 7,940,121 B2* | 5/2011 | Nomasaki | H01L 27/0629 |
| | | | 330/253 |
| 8,200,179 B1 | 6/2012 | Mosinskis et al. | |
| 8,335,249 B1 | 12/2012 | Su et al. | |
| 8,543,072 B1* | 9/2013 | Yahav | H03F 3/245 |
| | | | 330/297 |
| 8,766,746 B2 | 7/2014 | Nedovic | |
| 8,816,745 B1 | 8/2014 | Raman et al. | |
| 9,088,253 B2* | 7/2015 | Kwon | H03F 3/193 |
| 2008/0204171 A1 | 8/2008 | Abel et al. | |
| 2012/0263223 A1 | 10/2012 | Rajaee et al. | |
| 2013/0069165 A1 | 3/2013 | Nedovic | |
| 2013/0187717 A1 | 7/2013 | Murphy et al. | |

OTHER PUBLICATIONS

Andrea F.P., et al., "10.6 Continuous-Time Linear Equalization with Programmable Active-Peaking Transistor Arrays in a 14nm FinFET 2mW/Gb/s 16Gb/s 2-Tap speculative DFE Receiver", 2015 IEEE International Solid-State Circuits Conference—(ISSCC) Digest of Technical Papers, IEEE, Feb. 22, 2015 (Feb. 22, 2015), pp. 1-3, XP032748129, DOI: 10.11 09/ISSCC. 2015.7062988 ISBN: 978-1-4799-6223-5 [retrieved on Mar. 17, 2015].

International Search Report and Written Opinion—PCT/US2016/050439—ISA/EPO—Nov. 29, 2016.

\* cited by examiner

AMPLIFIER WITH BOOSTED PEAKING

BACKGROUND

Field

Aspects of the present disclosure relate generally to amplifiers, and more particularly, to amplifiers with boosted peaking.

Background

In a communication system, signals may be transmitted from a transmitting device to a receiving device across a channel (e.g., a cable). The channel may be bandwidth limited, in which the channel attenuates signals at high frequencies. The frequency-dependent attenuation can cause distortions in signals transmitted across the channel, especially high frequency signals (e.g., high data-rate signals). To address this, the receiving device may include an amplifier with boosted peaking at high frequencies (also referred to as an equalizer) to compensate for the signal attenuation at high frequencies. The compensation allows the receiving device to receive signals at higher frequencies, and therefore receive data at higher data rates.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, an amplifier is provided. The amplifier comprises a load circuit comprising a plurality of inductor cells, and a drive circuit configured to receive an input signal, and to drive the load circuit based on the input signal to generate an amplified signal. The amplifier further comprises a controller configured to adjust a number of the inductor cells that are enabled to tune a peaking gain of the amplifier.

A second aspect relates to a method for tuning a peaking gain of an amplifier. The method comprises receiving an input signal, and driving a load circuit of the amplifier based on the received input signal to generate an amplified signal, the load circuit comprising a plurality of inductor cells. The method also comprises tuning the peaking gain of the amplifier by adjusting a number of the inductor cells that are enabled.

A third aspect relates to an apparatus for tuning a peaking gain of an amplifier. The apparatus comprises means for receiving an input signal, and means for driving a load circuit of the amplifier based on the received input signal to generate an amplified signal, the load circuit comprising a plurality of inductor cells. The apparatus further comprises means for tuning the peaking gain of the amplifier by adjusting a number of the inductor cells that are enabled.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
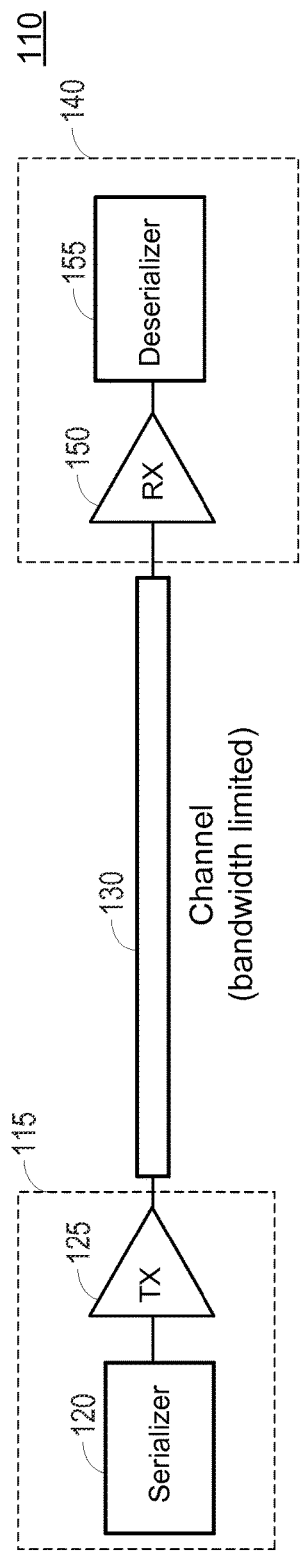
FIG. 1 shows an exemplary communication system according to certain aspects of the present disclosure.

FIG. 1 shows an example of a communication system 110 for transmitting data from a transmitting device 115 to a receiving device 140 over a channel 130. The communication system 110 may be used, for example, in a Serializer/Deserializer (SerDes) system to transmit high-speed serial data (e.g., 5 Gbits/s or higher) over the channel 130. In this regard, the transmitting device 115 may include a serializer 120 for converting parallel data streams into a high-speed serial data stream and a transmitter 125 for transmitting the serial data stream over the channel 130. The receiving device 140 may comprise a receiver 150 for receiving the serial data stream from the channel 130, and a deserializer 155 for converting the serial data back into parallel data for further processing. The channel 130 may include one or more printed circuit board (PCB) traces, a cable (e.g., a twisted-pair cable, a coaxial cable, etc.), and/or other type of channel.

Figure 2:
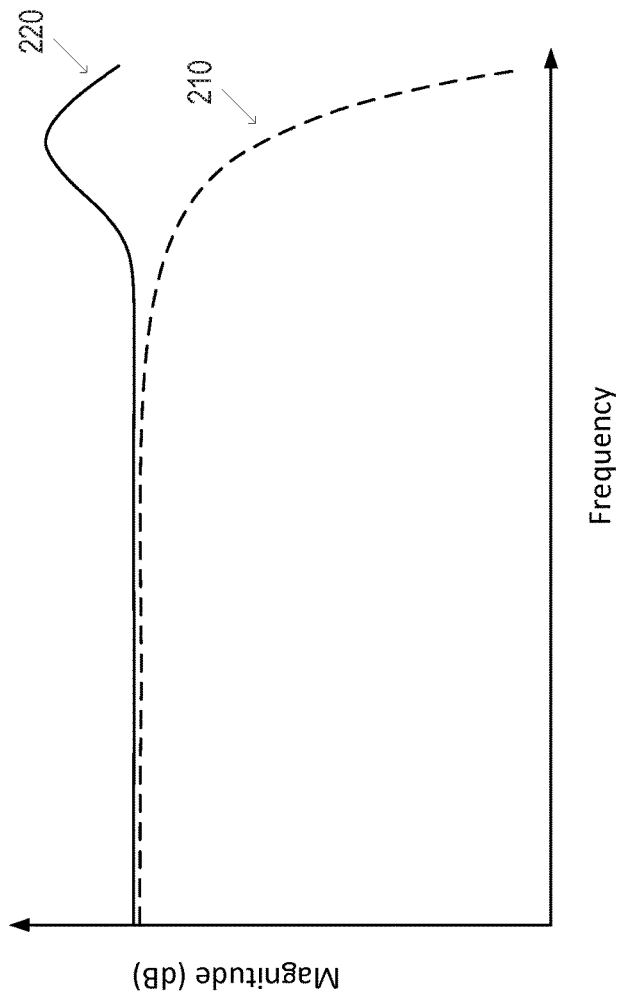
FIG. 2 is a plot showing an exemplary frequency response of a channel and an exemplary frequency response of an amplifier with boosted peaking according to certain embodiments of the present disclosure.

Typically, the channel 130 is bandwidth limited, which causes the channel 130 to attenuate signals at high frequencies. An example of this is illustrated in FIG. 2, which shows an exemplary frequency response 210 of the channel 130. As shown in FIG. 2, the frequency response 210 of the channel 130 rolls off at high frequencies. To compensate for the signal attenuation, the receiver 150 may include an amplifier with boosted peaking (e.g., a continuous-time linear equalizer (CTLE)). The amplifier compensates for the signal attenuation by peaking the received signal at high frequencies (e.g., a few GHz). An example of this is illustrated in FIG. 2, which shows an exemplary frequency response 220 of the amplifier. As shown in FIG. 2, the gain of the amplifier peaks at high frequencies to compensate for the signal attenuation of the channel 130. This results in a combined frequency response that is approximately flat over a wider frequency band than the frequency response of the channel 130. Thus, the amplifier with boosted peaking extends the frequency band of the communication system 110, and therefore the rate at which data can be transmitted between the transmitting device 115 and the receiving device 140. For example, the amplifier may provide boosted peaking in the gigahertz range (e.g., between one and 10 GHz) for a SerDes communication system to facilitate data rates in the gigahertz range.

It may be desirable to tune the peaking gain of the amplifier. For example, the receiver 150 may support different channels with different signal-attenuation characteristics. In this example, it may be desirable to tune the peaking gain of the amplifier to compensate for signal attenuation for a particular channel to provide a flat frequency response over a desired frequency band. As used herein, peaking gain may refer to the maximum gain of the amplifier over a frequency range (e.g., entire frequency range).

Figure 3:
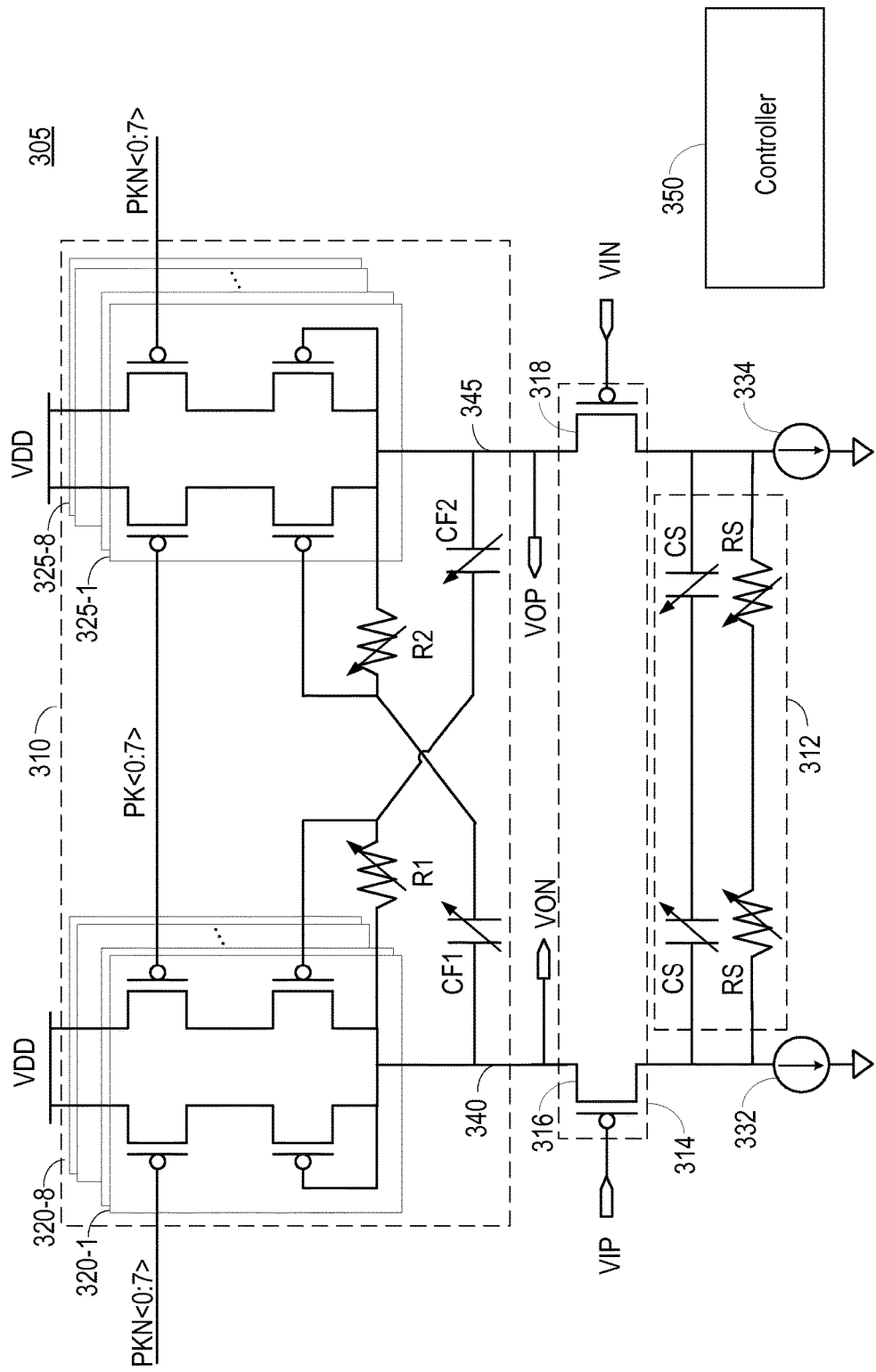
FIG. 3 shows an amplifier with boosted peaking according to certain aspects of the present disclosure.

In this regard, FIG. 3 shows an exemplary amplifier 305 with boosted peaking according to certain aspects of the present disclosure. The amplifier 305 is configured to receive an input differential signal (VIP and VIN) from a bandwidth-limited channel 130 (shown in FIG. 1), amplify the input differential signal, and output the amplified differential signal (VON and VOP). The amplifier 305 may output the resulting amplified signal to a deserializer to convert the output signal into parallel data streams, output the amplified signal to a slicer to recover data (e.g., data bits) from the signal, and/or other circuitry for further processing. The gain of the amplifier 305 may be boosted at high frequencies to compensate for signal attenuation in the channel 130. As discussed further below, the peaking gain of the amplifier 305 may be tuned, for example, based on the signal-attenuation characteristics of the channel 130.

The amplifier 305 may include a drive circuit 314, a tunable load circuit 310, and a source degeneration circuit 312. The drive circuit 314 is configured to convert the input differential signal (VIP and VIN) into a differential current. The differential current drives the load circuit 310 to generate the amplified differential signal (VON and VOP) of the amplifier 305. In the example in FIG. 3, the drive circuit 314 has a first input transistor 316 (e.g., first N-type metal-oxide-semiconductor (NMOS) transistor) and a second input transistor 318 (e.g., second NMOS transistor). The gate of the first input transistor 316 is driven by input voltage signal VIP and the gate of the second input transistor 318 is driven by input voltage signal VIN. The first input transistor 316 converts input voltage signal VIP into a first current in a first leg 340 of the drive circuit 314, and the second input transistor 316 converts input voltage signal VIN into a second current in a second leg 345 of the drive circuit 314. The first and second currents form a differential current that drives the load circuit 310 to generate the amplified differential signal (VON and VIN) at the differential output of the amplifier 305. In the example in FIG. 3, output signal VON is taken between the drain of the first input transistor 316 and the load circuit 310, and output signal VOP is taken between the drain of the second input transistor 318 and the load circuit 310.

In the example in FIG. 3, the source degeneration circuit 312 is coupled to the sources of the first and second input transistors 316 and 318. The source degeneration circuit 312 includes source capacitors CS and source resistors RS. The source capacitors CS are coupled in series between the sources of the first and second input transistors 316 and 318, and the source resistors RS are coupled in series between the sources of the first and second input transistors 316 and 318.

At low frequencies, the source capacitors CS are approximately open. The low frequencies may encompass frequencies at which signal attenuation by the channel 130 is low (e.g., below 1 dB). In this case, the source resistors RS lower (degenerate) the gain of the amplifier 305. At high frequencies, the source capacitors CS short the source resistors RS. As a result, the source resistors RS no longer lower the gain of the amplifier 305. This, in effect, boosts the gain of the amplifier 305 at high frequencies relative to the gain of the amplifier 305 at low frequencies. Thus, the source degeneration circuit 312 facilitates gain boosting at high frequencies.

In certain aspects, the source resistors RS may have tunable resistances and the source capacitors CS may have tunable capacitances. In these aspects, the resistances of the source resistors RS may be tuned to adjust the peaking gain. Also, the resistances of the source resistors RS and/or the capacitances of the source capacitors CS may be tuned to adjust the location of the peaking in frequency by adjusting the RC time constant of the source degeneration circuit 312.

The load circuit 310 is configured to provide a load having an impedance that increases at high frequencies. The increased impedance at high frequencies boosts the gain of the amplifier 305 at high frequencies to compensate for signal attenuation in the channel 130 at high frequencies, as discussed further below. In the example in FIG. 3, the load circuit 310 is coupled to the drains of the first and second input transistors 316 and 318.

The load circuit 310 includes a first set of active inductor cells 320-1 to 320-8 coupled in parallel between the first leg 340 of the drive circuit 314 and the supply rail VDD, and a second set of active inductor cells 325-1 to 325-8 coupled in parallel between the second leg 345 of the drive circuit 314 and the supply rail VDD. In certain aspects, a controller 350 may selectively enable each one of the first set of inductor cells 320-1 to 320-8 and each one of the second set of inductor cells 325-1 to 325-8 using control bits PK<0:7> and complementary control bits PKN<0:7>. As discussed further below, the controller 350 may tune the peaking gain of the amplifier 305 by adjusting the number of inductor cells that are enabled in each one of the first and second sets of inductor cells. For ease of illustration, the individual connections between the controller 350 and the inductor cells are not shown in FIG. 3.

Figure 4:
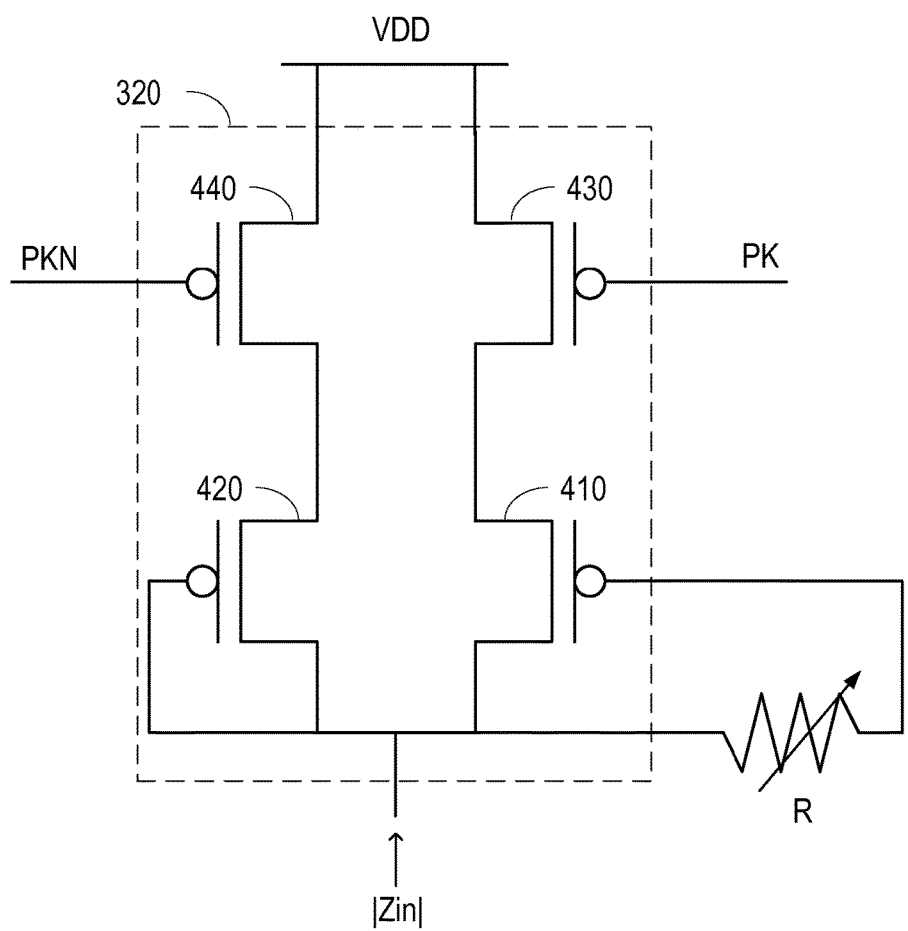
FIG. 4 shows an active inductor cell according to certain aspects of the present disclosure.

FIG. 4 shows an enlarged view of one implementation of one of the inductor cells 320. The inductor cell 320 includes an inductor transistor 410 (p-type metal-oxide-semiconductor (PMOS) transistor) with a series-gate resistor R coupled between the drain and gate of the inductor transistor 410. The inductor cell 320 also includes a diode-connected transistor 420 (e.g., diode-connected PMOS transistor), in which the drain and source of the diode-connected transistor 420 are tied together. The inductor cell 320 further includes a first switching transistor 430 coupled between the inductor transistor 410 and the supply rail VDD, and a second switching transistor 440 coupled between the diode-connected transistor 420 and the supply rail VDD. The gate of the first switching transistor 430 is driven by one of the control bits PK and the gate of the second switching transistor 440 is driven by the respective complementary control bit PKN. Thus, only one of the first and second switching transistors 430 and 440 is turned on at a time.

In operation, the controller 350 enables the inductor cell 320 by turning on the first switching transistor 430 and turning off the second switching transistor 440 (i.e., PK=0 and PKN=1 for the example in which each switching transistor is a PMOS transistor). As a result, the source of the inductor transistor 410 is coupled to the supply rail VDD and the source of the diode-connected transistor 420 is decoupled from the supply rail VDD. In this case, the inductor transistor 410 and the series-gate resistor R provide an impedance Zin looking into the inductor cell 320 that behaves like an inductor (i.e., increased impedance at high frequencies), as discussed further below. The increased impedance at high frequencies boosts the gain of the amplifier 305 at high frequencies (e.g., gigahertz range). It is to be appreciated that the inductor transistor 410 and the series-gate resistor R do not necessarily form a physical inductor (e.g., an inductor coil), but rather mimic (exhibit) the impedance characteristics of a physical inductor.

At DC (approximately zero hertz), the inductor transistor 410 and the series-gate resistor R provide an impedance Zin approximately equal to $1/gm_1$, where $gm_1$ is the transconductance of the inductor transistor 410. At high frequencies, the gate-to-source capacitor (not shown) of the inductor transistor 410 shorts, causing the impedance Zin to be approximately equal to the resistance of the series-gate resistor R. This results in increased impedance at high frequencies, assuming the resistance of the series-gate resistor RF is greater than $1/gm_1$.

The controller 350 disables the inductor cell 320 by turning off the first switching transistor 430 and turning on the second switching transistor 440. Specifically, in the current example where the first and second switching transistors 430 and 440 are PMOS transistors, the controller 350 sets PK to 1 and PKN to 0 in order to turn off the first switching transistor 430 and turn on the second switching transistor 440. As a result, the source of the inductor transistor 410 is decoupled from the supply rail VDD and the source of the diode-connected transistor 420 is coupled to the supply rail VDD. In this case, the diode-connected transistor 420 provides a diode-connected load. At DC, the diode-connected transistor 420 provides an impedance Zin approximately equal to $1/gm_2$, where $gm_2$ is the transconductance of the diode-connected transistor 420. If the inductor transistor 410 and diode-connected transistor 420 have approximately the same size (e.g., gate width), then the transconductance $gm_1$ of the inductor transistor 410 may be approximately equal to the transconductance $gm_2$ of the diode-connected transistor 420. Thus, in this example, the impedance Zin of the inductor cell 320 may be approximately the same at DC whether the inductor cell 320 is enabled or disabled.

Referring back to FIG. 3, each one of the first set of inductor cells 320-1 to 320-8 and each one of the second set of inductor cells 325-1 to 325-8 may be implemented using the exemplary active inductor cell 320 shown in FIG. 4. In the example in FIG. 3, the amplifier 305 has a first series-gate resistor R1 coupled between the gate and drain of the inductor transistor in each of the first set of inductor cells 320-1 to 320-8. Thus, for each of the first set of inductor cells, the first series-gate resistor R1 corresponds to the series-gate resistor shown in FIG. 4. The amplifier 305 also includes a second series-gate resistor R2 coupled between the gate and drain of the inductor transistor in each of the second set of inductor cells 325-1 to 325-8. Thus, for each of the second set of inductor cells, the second series-gate resistor R2 corresponds to the series-gate resistor shown in FIG. 4.

The amplifier 305 also includes a first current source 332 coupled to the source of the first input transistor 314, and a second current source 334 coupled to the source of the second input transistor 318. The first and second current sources 332 and 334 may be configured to DC bias the amplifier 305 with DC currents. As discussed above, the impedance looking into each inductor cell in the load circuit 310 may be the same at DC whether the inductor cell is enabled or disabled. As a result, the DC bias voltages of the amplifier 305 may be approximately unaffected by the number of inductor cells that are enabled. This provides stable DC biasing of the amplifier 305 even when the peaking gain of the amplifier 305 is tuned by adjusting the number of inductor cells that are enabled.

Figure 5:
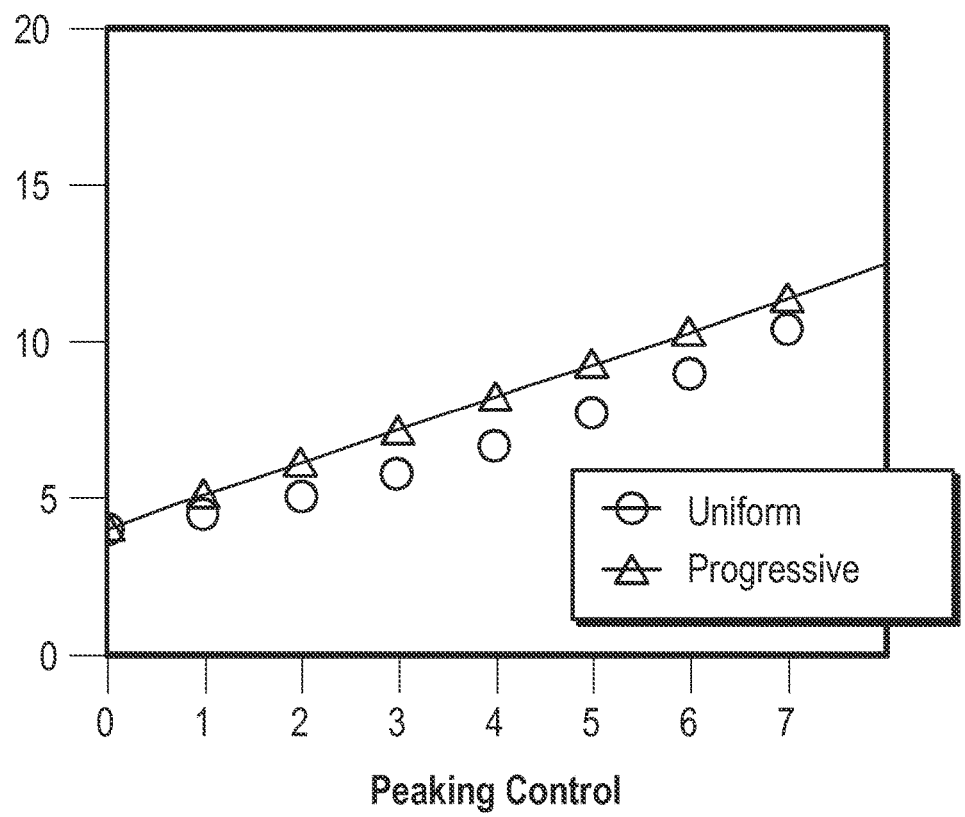
FIG. 5 is a graph showing examples of peaking gains as a function of peaking control according to certain aspects of the present disclosure.

As discussed above, the controller 350 can tune the peaking gain of the amplifier 305 by adjusting the number of inductor cells that are enabled in each one of the first set of inductor cells 320-1 to 320-8 and second set of inductor cells 325-1 to 325-8. In this regard, FIG. 5 shows an exemplary graph of the peaking gain of the amplifier 305 as a function of the number of inductor cells that are enabled in each one of the first and second sets of inductor cells 320-1 to 320-8 and 325-1 to 325-8. FIG. 5 shows the peaking gain for two different cases. In the first case, the sizes of the inductor cells 320-1 to 320-8 and 325-1 to 325-8 are approximately uniform (circles). In the second case, the inductor cells in each of the first and second sets of inductor cells 320-1 to 320-8 and 325-1 to 325-8 are progressively sized (triangle). More particularly, for the first set of inductor cells 320-1 to 320-8, inductor cell 320-2 is smaller than inductor cell 302-1, inductor cell 320-3 is smaller than inductor cell 320-2, inductor cell 320-4 is smaller than inductor cell 320-3, and so forth. The same applies to the second set of inductor cells 325-1 to 325-8. Thus, as the controller 350 enables more of the inductor cells in each of the first and second pluralities of inductor cells, the controller 350 enables progressively smaller ones of the inductor cells in each of the first and second pluralities of indictor cells.

In one example, the size of each inductor cell may correspond to the gate width of the respective inductor transistor. Thus, for the first case, the gate widths of the inductor transistors in the inductor cells may be approximately the same. For the second case, the gate widths of the inductor transistors in each of the first and second sets of the inductor cells 320-1 to 320-8 and 325-1 to 325-8 are progressively sized. More particularly, for the first set of inductor cells 320-1 to 320-8, the inductor transistor of inductor cell 320-2 has a smaller gate width than the inductor transistor of inductor cell 302-1, the inductor transistor of inductor cell 320-3 has a smaller gate width than the inductor transistor of inductor cell 320-2, and so forth. The same applies to the second set of inductor cells 325-1 to 325-8. Thus, as the controller 350 enables more of the inductor cells in each of the first and second pluralities of inductor cells, the controller 350 enables progressively smaller ones of the inductor transistors in each of the first and second pluralities of indictor cells.

Figure 6:
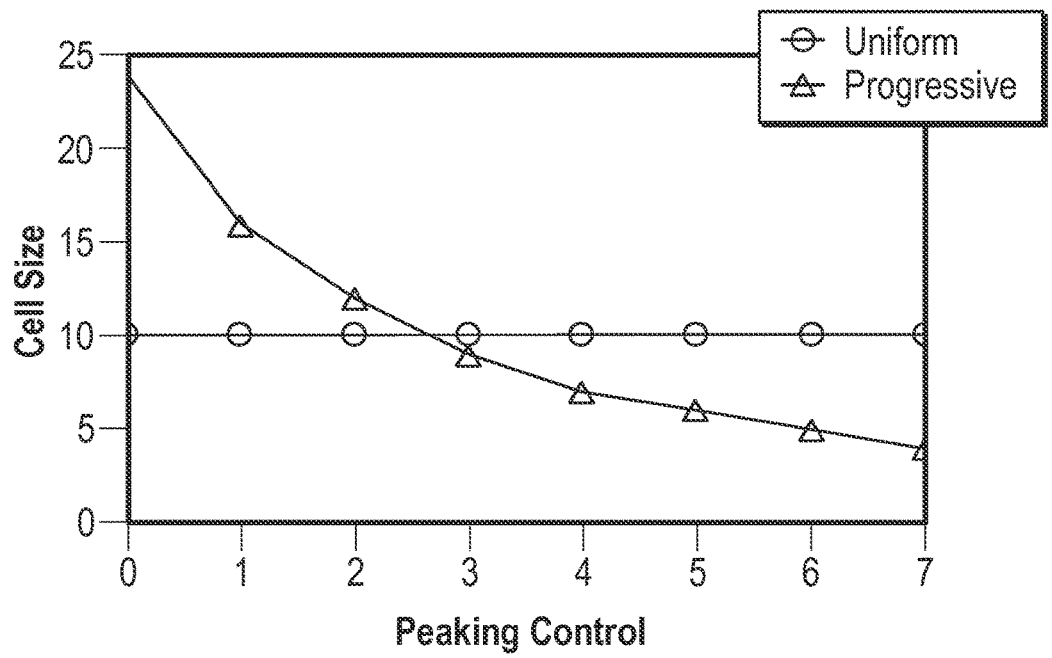
FIG. 6 is a graph showing examples of inductor cell size as a function of peaking control according to certain aspects of the present disclosure.

In this regard, FIG. 6 shows a graph of the sizes of the inductor cells for the two cases. As shown in FIG. 6, for the second case, the cell size in each of the first and second pluralities of inductor cells decreases as more inductor cells in each of the first and second pluralities of inductor cells are enabled. It is to be appreciated that the controller 350 may enable two inductor cells at a time (one in the first plurality of inductor cells 320-1 to 320-8 and one in the second plurality of inductor cells 325-1 to 325-8), in which the two inductor cells may have approximately the same size to balance the load on both sides of the amplifier 305. In this regard, the peaking control shown in FIG. 6 corresponds to the number of inductor cells that are enabled in each of the first and second pluralities of inductor cells 320-1 to 320-8 and 325-1 and 325-8.

As shown in FIG. 5, for the first case in which the inductor cells are uniformly sized, the peaking gain increases non-linearly as the controller 350 enables more inductor cells in each of the first and second pluralities of inductor cells. Thus, for the first case, the peak control in nonlinear. This nonlinearity may make it difficult for the controller 350 to achieve a desired peak gain.

In contrast, for the second case in which the inductor cells in each of the first and second pluralities of inductor cells are progressively sized, the peaking gain increases linearly as the controller 350 enables more inductor cells in each of the first and second pluralities of inductor cells. This is because making the sizes of the inductor cells progressively smaller in each of the first and second sets of inductor cells corrects for the nonlinear increases in the peaking gain in the first case. Thus, progressively sizing the inductor cells in each of the first and second sets of inductor cells can provide the controller 350 with approximately linear peak control.

Figure 7:
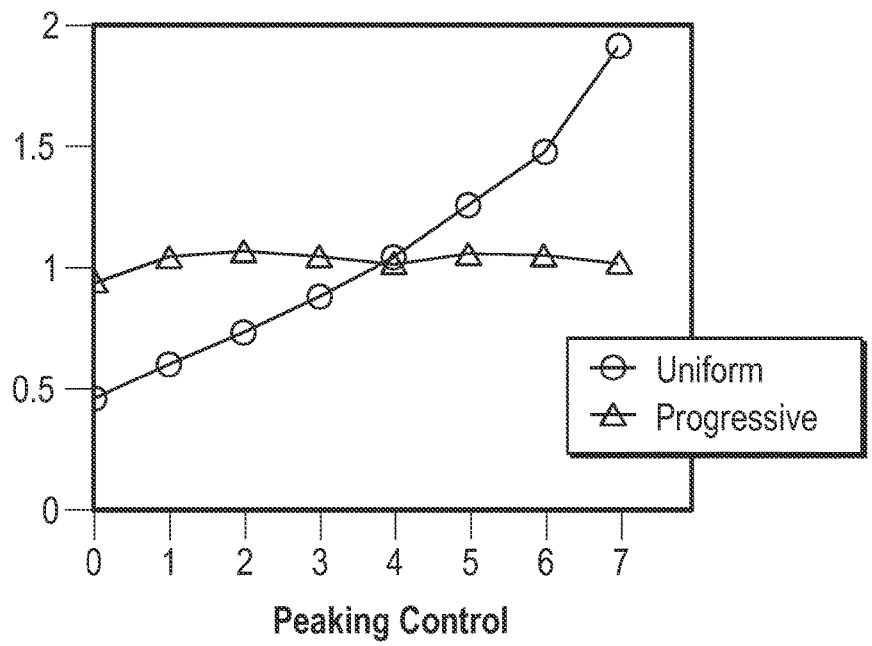
FIG. 7 shows examples of peaking gain step size as a function of peaking control according to certain aspects of the present disclosure.

Thus, aspects of the present disclosure enable the controller 350 to linearly tune the peaking gain of the amplifier 305 by progressively sizing the inductor cells in each of the first and second sets of inductor cells. The linear tuning results in uniform step increases in the peaking gain as more inductor cells in each of the first and second sets of inductor cells are enabled. An example of this is shown in FIG. 7, which shows the step size increases in gain for the two cases. In this example, the step increases for the progressively sized case are approximately uniform at approximately one dB. In other words, each time the controller 350 enables an inductor cell in each of the first and second pluralities of inductor cells, the peaking gain increases by approximately one dB. In contrast, the step increases are highly non-uniform for the case where the inductor cells are uniformly sized. More particularly, the step size increases as more inductor cells in each of the first and second sets of inductor cells are enabled.

Figure 8:
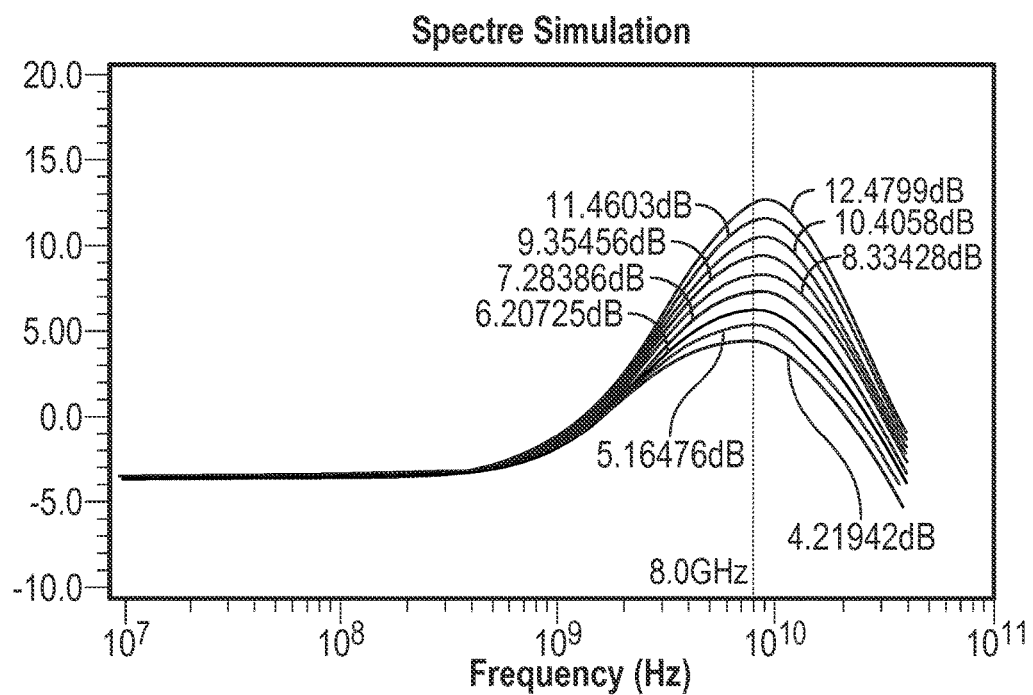
FIG. 8 shows peaking gains for different peaking control settings for a case of progressively sized inductor cells according to certain aspects of the present disclosure.
Figure 9:
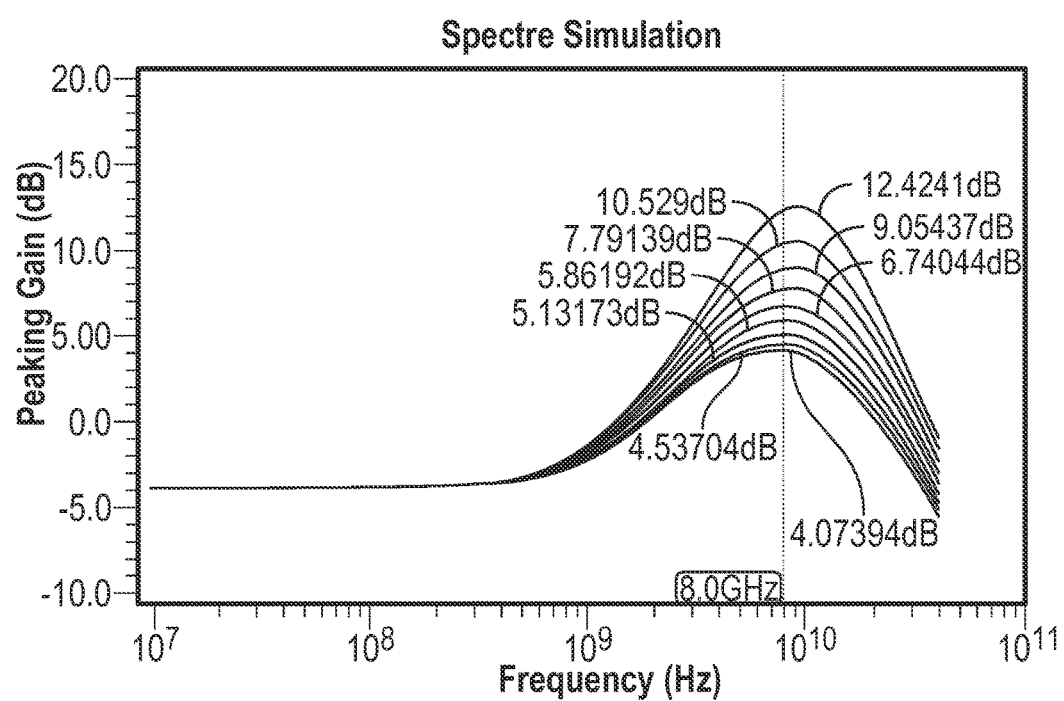
FIG. 9 shows peaking gains for different peaking control settings for a case of uniformly sized inductor cells according to certain aspects of the present disclosure.

FIG. 8 shows the different peaking gains for the different peaking control settings for the second case in which the inductor cells in each of the first and second sets of inductor cells are progressively sized. As shown in FIG. 8, the peaking gains are approximately uniformly spaced at a frequency of approximately 8.0 GHz. In contrast, FIG. 9 shows the different peaking gains for the different peaking control settings for the case in which the inductor cells are uniformly sized. As shown in FIG. 9, the peaking gains are non-uniformly spaced at approximately 8.0 GHz.

Referring back to FIG. 3, the amplifier 305 may further include feedback capacitors CF1 and CF2 to extend the range over which the peaking gain of the amplifier 305 may be tuned, as discussed further below. In the example in FIG. 3, a first one of the feedback capacitors CF1 is coupled between output VON and the gates of the inductor transistors of the second set of inductor cells 325-1 to 325-8, and a second one of the feedback capacitors CF2 is coupled between output VOP and the gates of the inductor transistors of the first set of inductor cells 320-1 to 320-8. At low frequencies, the feedback capacitors CF1 and CF2 are open. At high frequencies, the feedback capacitors CF1 and CF2 short, in which case, the feedback capacitors CF1 and CF2 cross couple the outputs VON and VOP of the amplifier with the first and second pluralities of inductor cells. This provides positive feedback at high frequencies, which boosts the gain of the amplifier 305 at high frequencies.

In certain aspects, the feedback capacitors CF1 and CF2 have tunable (programmable) capacitances. In these aspects, the controller 350 can adjust the capacitances of the feedback capacitors CF1 and CF2 to further tune the peaking gain of the amplifier 305. For example, the controller 350 may increase the capacitances of the feedback capacitors CF1 and CF2 to increase the peaking gain of the amplifier 305. Thus, the controller 350 may adjust the capacitances of the feedback capacitors CF1 and CF2 to extend the range over which the peaking gain can be tuned compared with using only the inductor cells 320-1 to 320-8 and 325-1 to 325-8. In certain aspects, the controller 350 may tune the peaking gain of the amplifier by both adjusting the capacitances of the feedback capacitors CF1 and CF2 and selectively enabling the inductor cells. Thus, the feedback capacitors CF1 and CF2 and the inductor cells may be used in combination to tune the peaking gain of the amplifier 305.

Figure 10:
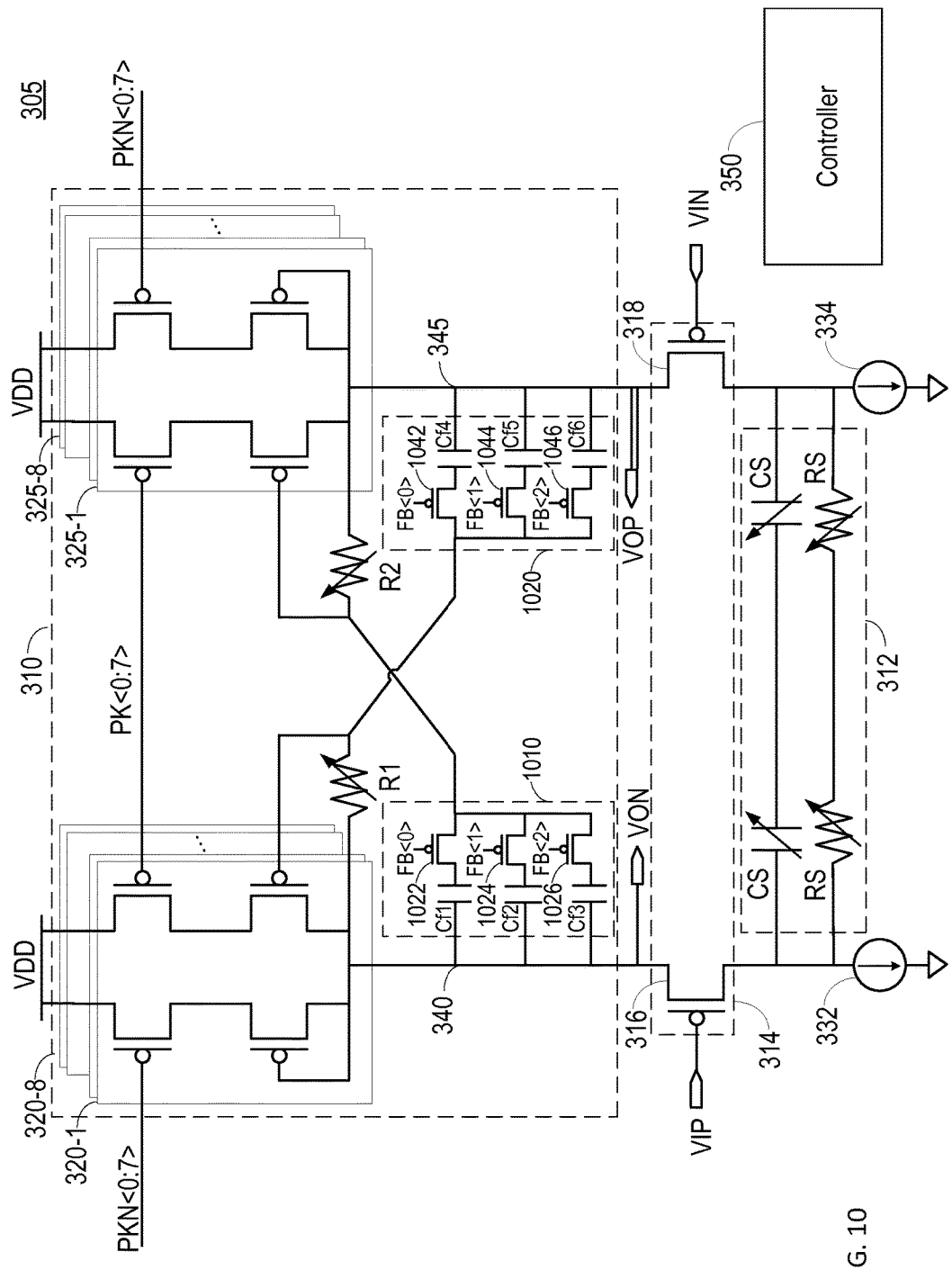
FIG. 10 shows an amplifier with boosted peaking comprising tunable feedback capacitors for tuning the peaking gain of the amplifier according to certain aspects of the present disclosure.

In certain aspects, each of the first and second feedback capacitors CF1 and CF2 may be implemented with a switch capacitor network. In this regard, FIG. 10 shows an example in which the first feedback capacitor CF1 is implemented with a first switch capacitor network 1010, and the second feedback capacitor CF2 is implemented with a second switch capacitor network 1020.

The first switch capacitor network 1010 comprises a first capacitor Cf1 and a first switch 1022 coupled in series, a second capacitor Cf2 and a second switch 1024 coupled in series, and a third capacitor Cf3 and a third switch 1026 coupled in series. Each capacitor and respective switch form a switchable capacitor. In this regard, a capacitor may be deemed to be switched on when the respective switch is turned on. In operation, the controller 350 adjusts the capacitance of the first switch capacitor network 1010 by selectively turning on switches 1022, 1024 and 1026 using respective switch control bits FB<0>, FB<1> and FB<2>. The capacitance of the first switch capacitor network 1010 is approximately equal to the sum of the capacitances of the capacitors that are switched on. In one aspect, each of the capacitors Cf1, Cf2 and Cf3 may have approximately the same capacitance (denoted "Cf"). Thus, in this aspect, the capacitance of the first switch capacitor network 1010 is Cf when one capacitor is switched on, 2Cf when two capacitors are switched on, and 3Cf when all three capacitors are switched on. In this aspect, the capacitors may be implemented with the same size to achieve approximately uniform gain stepping. However, in other aspects, different sizes may be used where, in order to get uniform stepping in other technology/design point/frequency, specific sizing is needed for each capacitor.

The second switch capacitor network 1020 comprises a fourth capacitor Cf4 and a fourth switch 1042 coupled in series, a fifth capacitor Cf5 and a fifth switch 1044 coupled in series, and a sixth capacitor Cf6 and a sixth switch 1046 coupled in series. Each capacitor and respective switch form a switchable capacitor. In this regard, a capacitor may be deemed to be switched on when the respective switch is turned on. In operation, the controller 350 adjusts the capacitance of the second switch capacitor network 1020 by selectively turning on switches 1042, 1044 and 1046 using respective switch control bits FB<0>, FB<1> and FB<2>. The capacitance of the second switch capacitor network 1020 is approximately equal to the sum of the capacitances of the capacitors that are switched on. In one aspect, each of the capacitors Cf4, Cf5 and Cf6 may have approximately the same capacitance (denoted "Cf").

Figure 11:
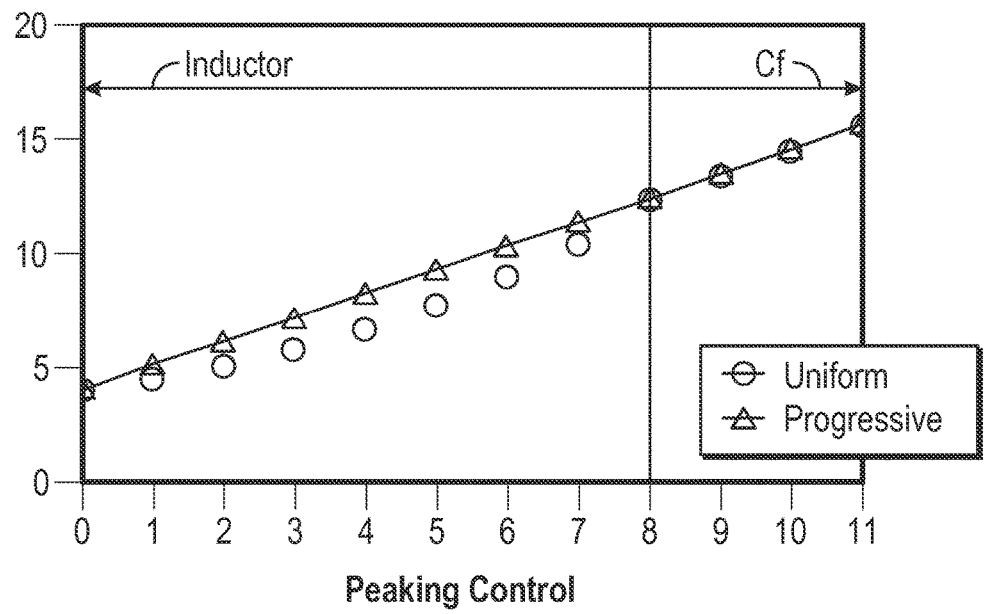
FIG. 11 shows examples of peaking gains as a function of peaking control for the amplifier in FIG. 10 according to certain aspects of the present disclosure.

FIG. 11 shows an exemplary graph of the peaking gain of the amplifier 305, in which the first and second feedback capacitors CF1 and CF2 are used to extend the range over which the peaking gain can be tuned compared with FIG. 5. In this example, the first and second feedback capacitors CF1 and CF2 are implemented with the first and second switch capacitor networks 1010 and 1020 shown in FIG. 10, in which each of the capacitors in the networks has approximately the same capacitance. After all of the inductor cells are enabled, the controller 350 may further increase the peaking gain by tuning the capacitances of the first and second switch capacitor networks 1010 and 1020. In this example, the controller 350 may increase the peaking gain in three additional steps by selectively switching on the capacitors in the switch capacitor networks 1010 and 1020. In the first step, the controller 350 switches on one of the capacitors in each switch capacitor network, in the second step, the controller 350 switches on two of the capacitors in each switch capacitor network, and, in the third step, controller 350 switches on all three capacitors in each switch capacitor network. As shown in FIG. 11, the switch capacitor networks 1010 and 1020 provide the controller 350 with approximately linear peak control.

Figure 12:
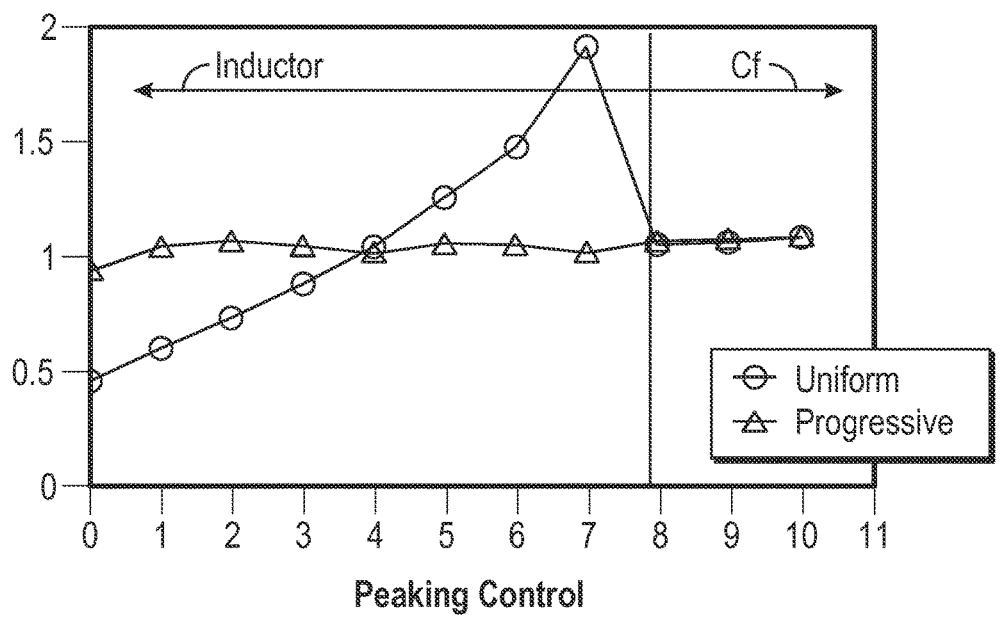
FIG. 12 shows examples of peaking gain step size as a function of peaking control for the amplifier in FIG. 10 according to certain aspects of the present disclosure.
Figure 13:
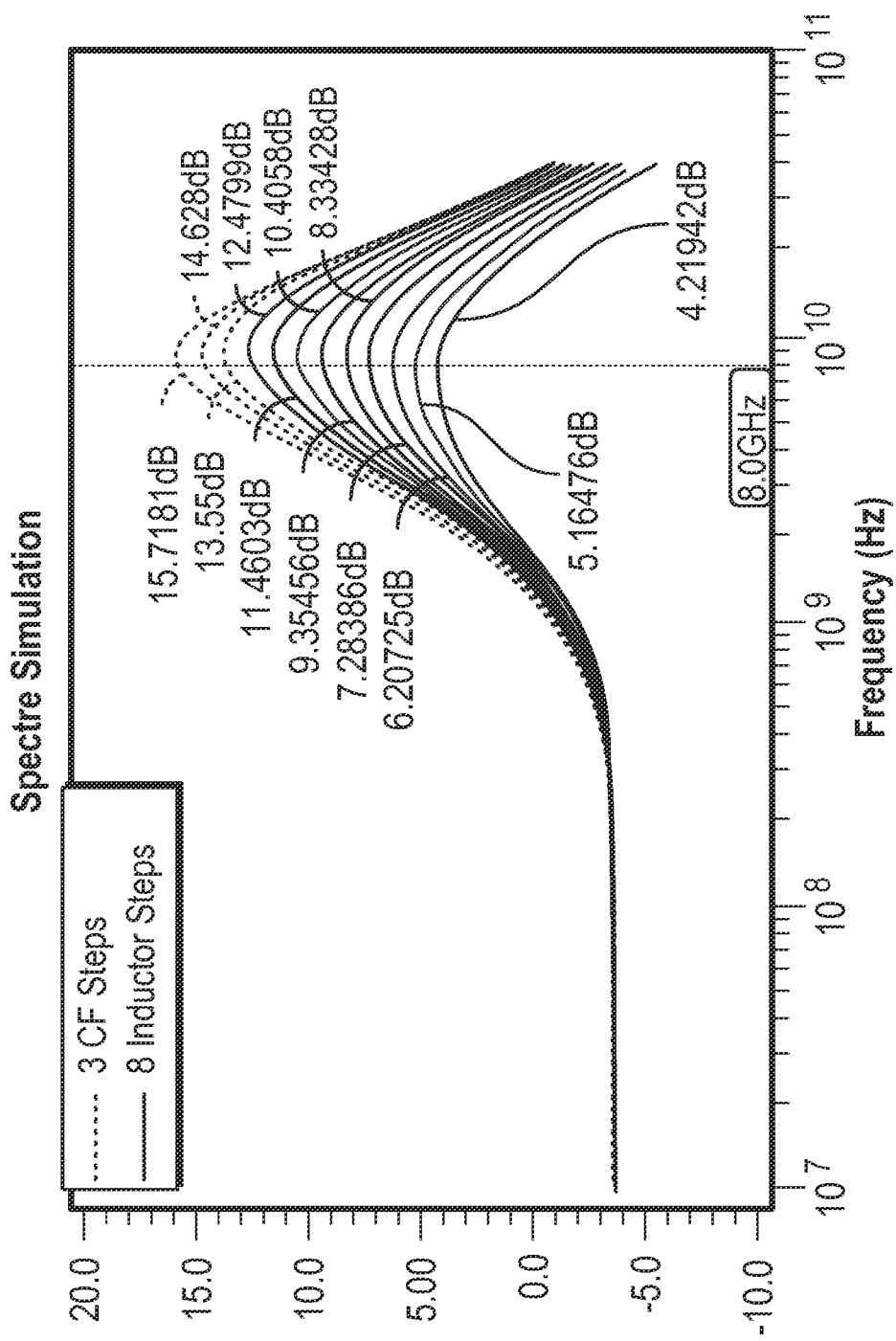
FIG. 13 shows peaking gains for different peaking control settings for the amplifier in FIG. 10 according to certain aspects of the present disclosure.

As shown in FIG. 12, the step increases provided by the switch capacitor networks 1010 and 1020 are approximately uniform. In other words, each time the controller 350 switches on a capacitor in each of the switch capacitor networks 1010 and 1020, the peaking gain increases by an approximately uniform step (approximately one dB in the example in FIG. 12). FIG. 13 shows the different peaking gains for the different peaking control settings. As shown in FIG. 13, the additional peaking gains provided by the switch capacitor networks 1010 and 1020 are approximately uniformly spaced at a frequency of approximately 8.0 GHz. Thus, the switch capacitor networks 1010 and 1020 extend the range over which the peaking gain of the amplifier can be increased in uniform steps.

As discussed above, the controller 350 may tune the peaking gain of the amplifier 305 based on the attenuation-characteristics of the channel 130. For example, the controller 350 may increase the peaking gain for a channel with higher attenuation in a desired frequency band (frequency band of signal being received), and decrease the peaking gain for a channel with lower attenuation in the desired frequency band. In other words, the controller 350 may tune the peaking gain according to the attenuation characteristics of the channel in a desired frequency band so that the combined frequency response of the channel and amplifier is approximately flat in the desired frequency band.

In one example, the amplifier 305 may support different types of channels (e.g., different types of cables) with different attenuation characteristics. In this example, the controller 350 may include a table in memory specifying a peak control setting for each type of channel. The control setting for each type of channel may be determined empirically and programmed into the table. In operation, the controller 350 may receive an indicator indicating the type of channel coupled to the receiving device 140. The controller 350 may then retrieve the corresponding peak control setting from the table, and tune the peaking gain of the amplifier 305 according to the retrieved peak control setting.

In another example, the controller 350 may determine a peak control setting by performing a calibration procedure. In this example, the transmitting device 115 may transmit a known data pattern (e.g., known data bit sequence) to the receiving device 140 for a certain number of times. Each time the known data pattern is transmitted, the controller 350 may tune the amplifier to a different peak control setting and determine whether the known data pattern is successfully received. The controller 350 may determine whether the data pattern is successfully received by comparing the received data pattern (e.g., data bit sequence) with the known data pattern (which may be stored in memory at the receiving device 140). If the received data pattern matches or closely matches the known data pattern, then the controller 350 may determine that the data pattern is successfully received. In this case, the controller 350 may determine the peak control setting at which the data pattern is successfully received, and program the peak control setting in memory. The memory may be an internal memory in the controller 350 or may be an external memory that is coupled to the controller 350. During communication between the transmitting device 115 and the receiving device 140, the controller 350 may tune the peaking gain of the amplifier according to the programmed peak control setting.

In certain aspects, the controller 350 may tune the frequency of the peaking gain, or in other words, adjust the location of the peaking gain in frequency. For example, the controller 350 may tune the frequency of the peaking gain based on the frequency band of the signal being received. In this regard, the controller 350 may increase the frequency of the peaking gain for a signal having a wider frequency band (e.g., a higher data-rate signal), and reduce the frequency of the peaking gain for a signal having a smaller frequency band (e.g., a lower data-rate signal). This may be done to achieve an approximately flat combined frequency response within the frequency band of the signal while attenuating noise outside of the frequency band.

Figure 14:
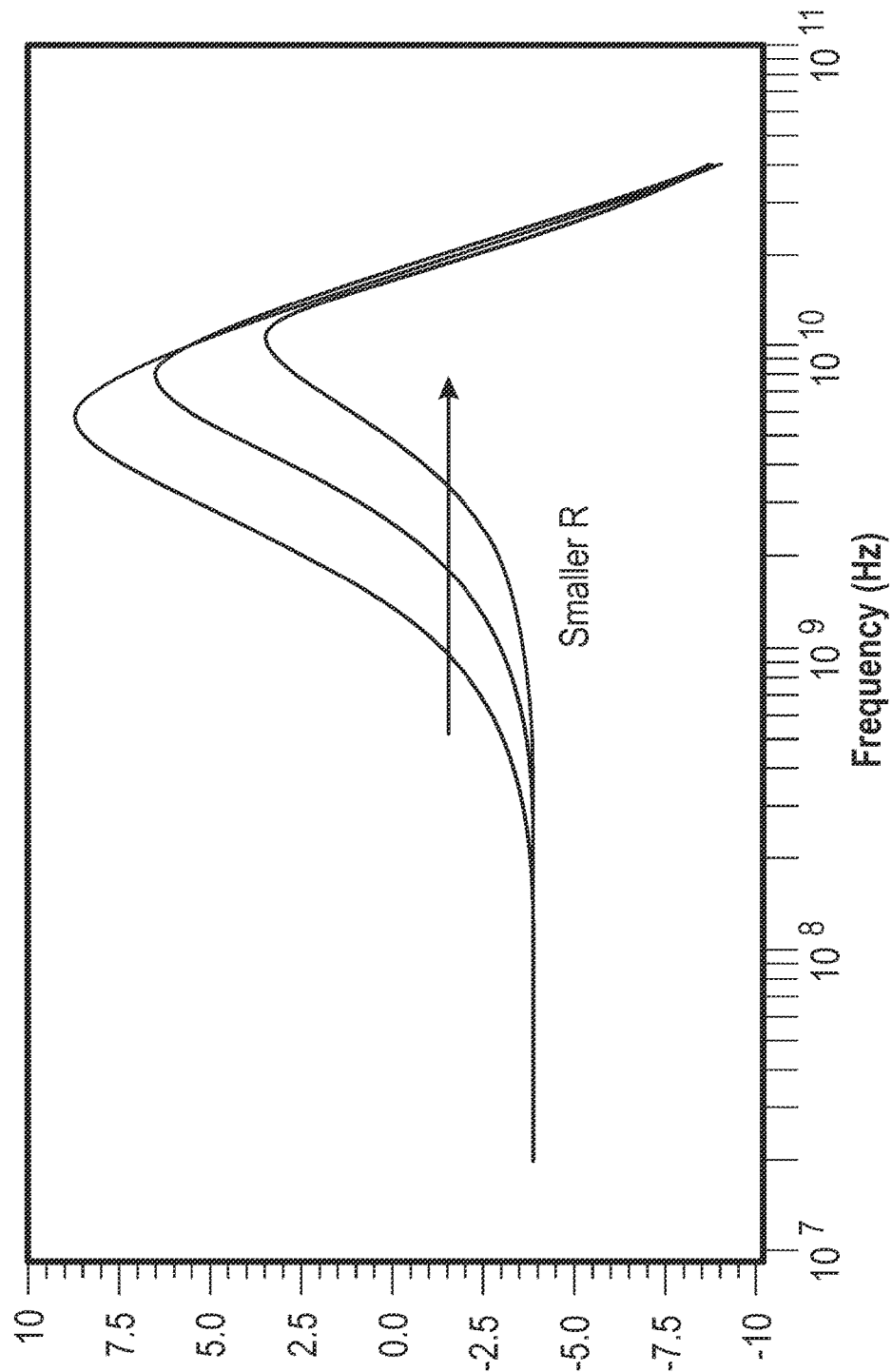
FIG. 14 is a graph showing examples of peaking gain locations for different resistance settings according to certain aspects of the present disclosure.

The controller 350 may tune the frequency of the peaking gain by adjusting the resistance of each of the series-gate resistors R1 and R2. In this example, the controller 350 may increase the frequency of the peaking gain by reducing the resistance of each of the series-gate resistors R1 and R2, and reduce the frequency of the peaking gain by increasing the resistance of each of the series-gate resistors R1 and R2. An example of this is illustrated in FIG. 14, which shows the peaking gains for three different resistances. As shown in FIG. 14, the peaking gain is shifted to higher frequencies for smaller resistances.

Figure 15:
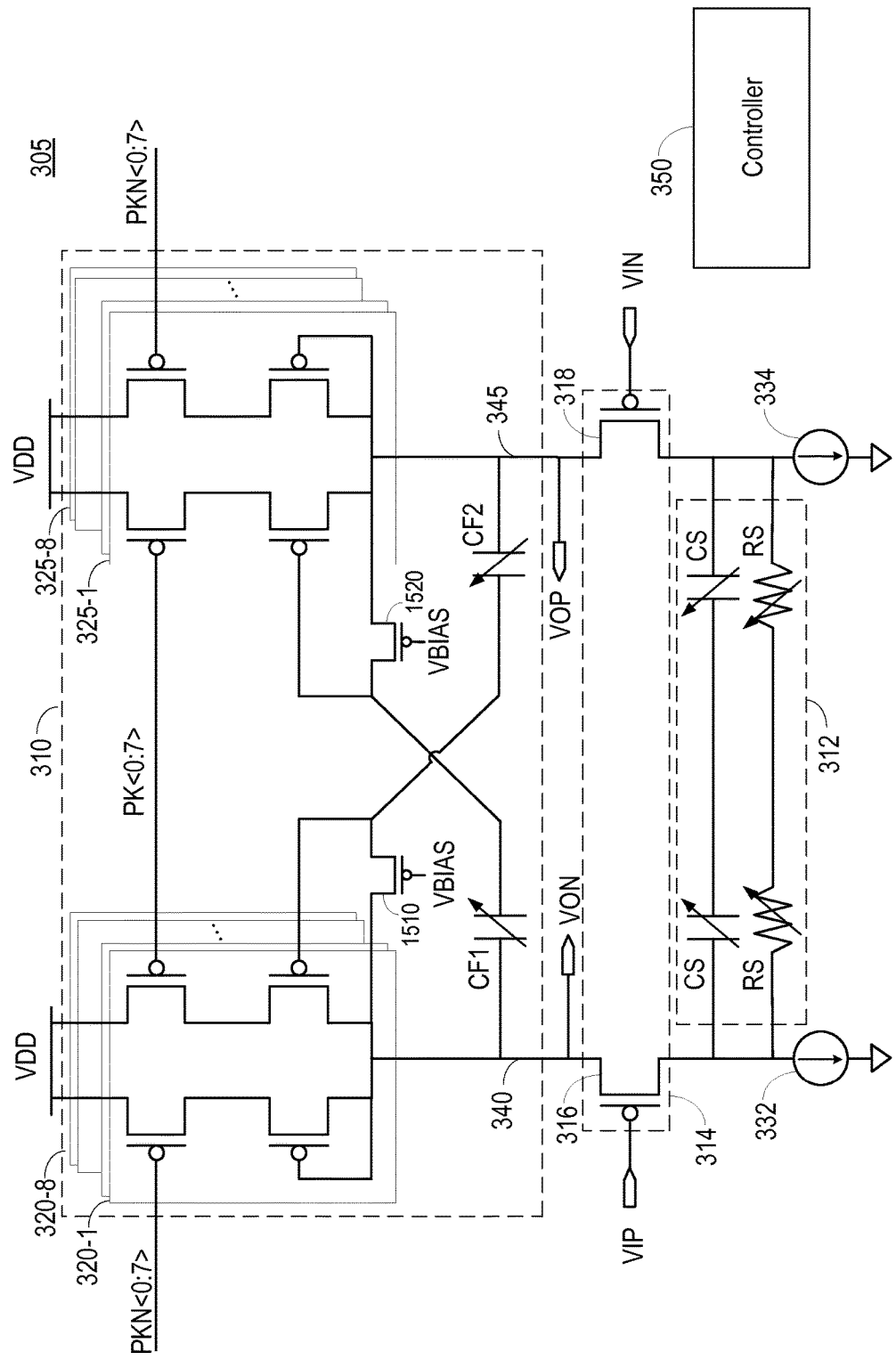
FIG. 15 shows an exemplary implementation of tunable resistors for tuning the peaking frequency of an amplifier according to certain aspects of the present disclosure.

In one implementation, each of the series-gate resistors R1 and R2 may be implemented with a transistor. In this regard, FIG. 15 shows an example in which the first series-gate resistor R1 is implemented with a first series-gate transistor 1510 (e.g., first PMOS transistor), and the second series-gate resistor R2 is implemented with a second series-gate transistor 1520 (e.g., second PMOS transistor). In this implementation, the resistance of each resistor is provided by the channel resistance of the respective transistor 1510 and 1520. The controller 350 adjusts the channel resistance of each transistor 1510 and 1520 by adjusting a bias voltage VBIAS applied to the gate of the transistor 1510 and 1520. Thus, in this implementation, the controller 350 adjusts the resistance of each series-gate resistor by adjusting the bias voltage VBIAS.

In another implementation, each of the series-gate resistors R1 and R2 may be implemented with a switch resistor network. In this embodiment, each switch resistor network may include a plurality of switchable resistors coupled in parallel, in which each switchable resistor includes a resistor and a respective switch coupled in series, and each switchable resistor has a different resistance. The controller 350 switches on a switchable resistor by turning on the respective switch. In operation, the controller 350 sets the resistance of each switch resistor network to a desired resistance by switching on the switchable resistor in the switch resistor network with the desired resistance.

Figure 16:
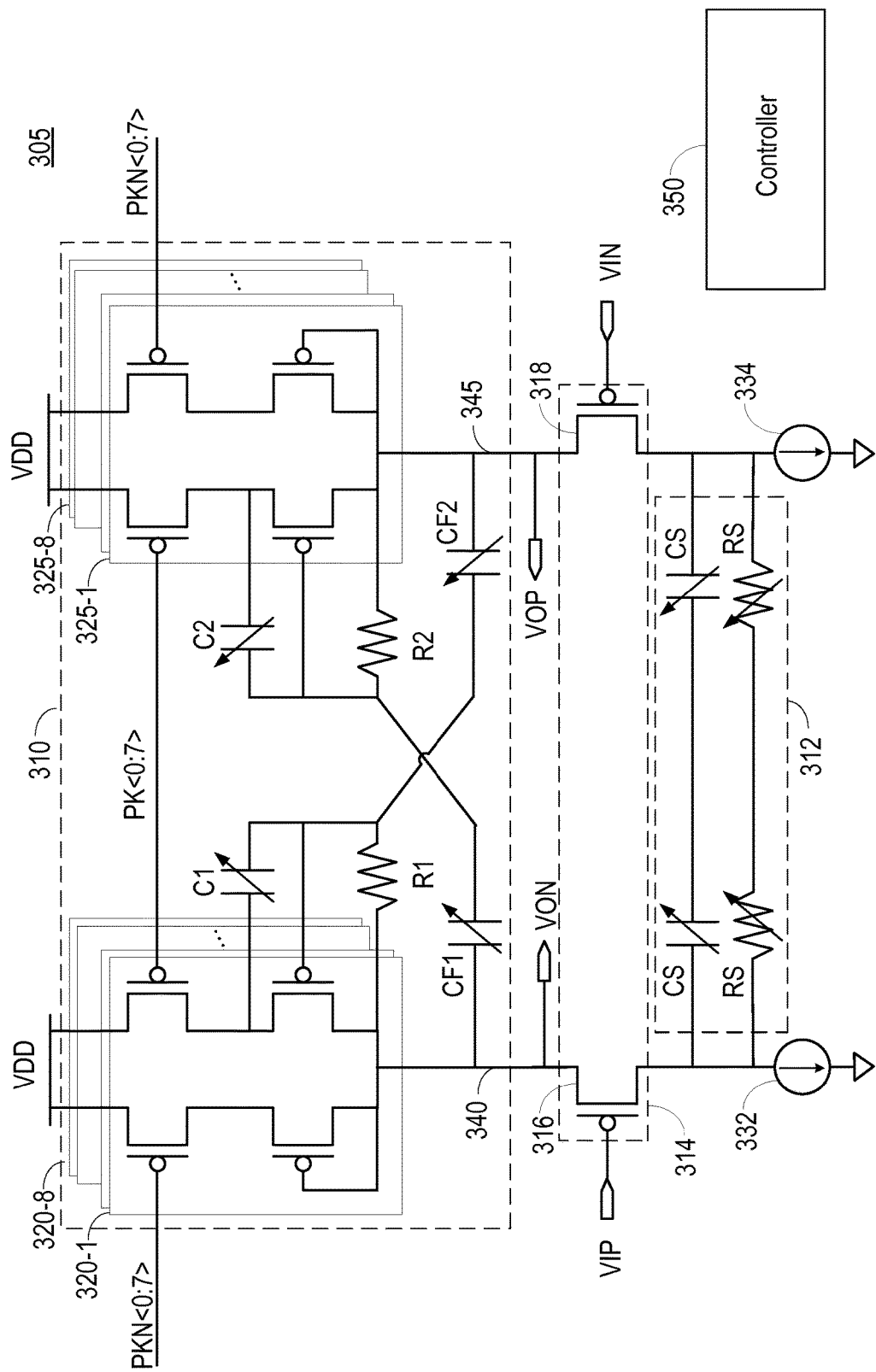
FIG. 16 shows an amplifier with boosted peaking comprising tunable capacitors for tuning the peaking frequency of the amplifier according to certain aspects of the present disclosure.

The controller 350 may also tune the frequency of the peaking gain using tunable capacitors. In this regard, FIG. 16 shows the amplifier 305 further including a first tunable gate-to-source capacitor C1 and a second tunable gate-to-source capacitor C2 according to certain aspects. The first gate-to-source capacitor C1 is coupled between the gate and source of each of the inductor transistors in the first plurality of inductor cells 320-1 to 320-8. Similarly, the second gate-to-source capacitor C2 is coupled between the gate and source of each of the inductor transistors in the second plurality of inductor cells 325-1 to 320-8. In these aspects, the controller 350 may tune the frequency of the peaking gain by adjusting the capacitance of each of the gate-to-source capacitors C1 and C2. Each of the gate-to-source capacitors C1 and C2 may be implemented with a switch capacitor network (e.g., similar to the switch capacitor networks shown in FIG. 10).

The tunable gate-to-source capacitors C1 and C2 are able to tune the frequency of the peaking gain because the frequency of the peaking gain is a function of an RC product, where the resistance R corresponds to the resistance of each series-gate resistor and the capacitance C corresponds to the gate-to-source capacitance of the inductor transistors in each of the first and second pluralities of the inductor cells. The first gate-to-source capacitor C1 is coupled between the gate and source of each of the inductor transistors in the first set of inductor cells 320-1 to 320-8, and the second gate-to-source capacitor C2 is coupled between the gate and source of each of the inductor transistors in the second set of inductor cells 325-1 to 325-8. Thus, the first gate-to-source capacitor C1 adds adjustable capacitance to the gate-to-source capacitance of the inductor transistors in the first set of inductor cells 320-1 to 320-8, and the second gate-to-source capacitor C2 adds adjustable capacitance to the gate-to-source capacitance of the inductor transistors in the second set of inductor cells 320-1 to 320-8. This allows the controller 350 to tune the capacitance C of the RC product by tuning the capacitances of the gate-to-source capacitors C1 and C2, and hence, tune the frequency of the peaking gain.

In certain aspects, the controller 350 may tune the frequency of the peaking gain based on the data rate of the signal being received. In these aspects, the controller 350 may support a plurality of different data rates, in which each data rate may correspond to a different frequency band (e.g., higher data rate may correspond to a wider frequency band). In this regard, the controller 350 may have a table in memory specifying a peaking frequency setting for each data rate. Each peaking frequency setting may correspond to a certain resistance for each series-gate resistor and/or a certain capacitance for each gate-to-source capacitor. In this example, the controller 350 may receive an indicator indicating the data rate of a signal to be received. In response, the controller 350 may retrieve the corresponding peaking frequency setting from the memory, and tune the frequency of the peaking gain of the amplifier 305 according to the retrieved setting.

Figure 17:
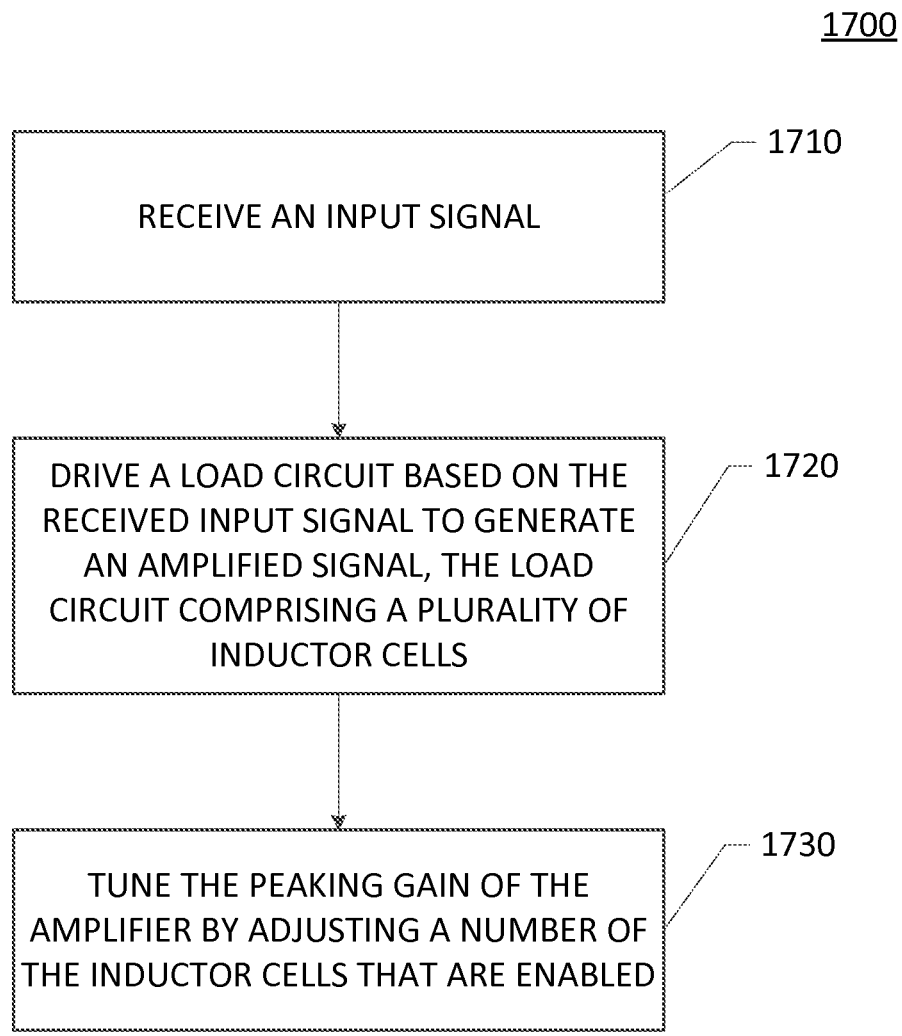
FIG. 17 is a flowchart illustrating a method for tuning a peaking gain of an amplifier according to certain aspects of the present disclosure.

FIG. 17 is a flowchart illustrating a method 1700 for tuning a peaking gain of an amplifier according to certain aspects.

In step 1710, an input signal is received. For example, the input signal may be from a channel (e.g., channel 130) exhibiting signal attenuation at high frequencies (e.g., gigahertz range).

In step 1720, a load circuit of the amplifier is driven based on the received input signal to generate an amplified signal, the load circuit having a set of inductor cells. For example, the load circuit may be driven by a drive circuit (e.g., drive circuit 314) based on the received input signal. Each of the inductor cells (e.g., inductor cells 320-1 to 320-8 and/or 325-1 to 325-8 in FIG. 3) may include an inductor transistor (e.g., inductor transistor 410) with a resistor coupled between the gate and drain of the inductor transistor to mimic the impedance characteristics of a physical inductor.

In step 1730, the peaking gain of the amplifier is tuned by adjusting a number of inductor cells that are enabled. For example, the peaking gain may be increased by enabling a larger number of the inductor cells, and the peaking gain may be reduced by enabling a smaller number of the inductor cells. In one example, the inductor cells may be progressively sized. In this example, the peaking gain may be increased by enabling progressively smaller ones of the inductor cells. As discussed above, this may be done to provide approximately uniform step increases in the peaking gain.

The controller according to any of the implementations discussed above may be implemented with a general-purpose processor, a digital signal processor (DSP), an application specific integrated circuit (ASIC), a field programmable gate array (FPGA) or other programmable logic device, discrete hardware components, or any combination thereof designed to perform the functions described herein. A general-purpose processor may be a microprocessor, but in the alternative, the processor may be any conventional processor, controller, microcontroller, or state machine. A processor may perform the functions described herein by executing software comprising code for performing the functions. The software may be stored on a computerreadable storage medium, such as a RAM, a ROM, an EEPROM, an optical disk, and/or a magnetic disk.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An amplifier, comprising:
a load circuit comprising a plurality of inductor cells, wherein each of the inductor cells has an impedance that is higher at a first frequency than at a second frequency, the first frequency being higher than the second frequency;
a drive circuit configured to receive an input signal, and to drive the load circuit based on the input signal to generate an amplified signal; and
a controller configured to adjust a number of the inductor cells that are enabled to tune a peaking gain of the amplifier.

2. The amplifier of claim 1, wherein the inductor cells are progressively sized, and the controller is configured to increase the peaking gain by enabling progressively smaller ones of the inductor cells.

3. The amplifier of claim 1, wherein the controller is configured to tune the peaking gain based on a peaking gain setting in a memory, the peaking gain setting corresponding to a number of the inductor cells to be enabled.

4. The amplifier of claim 1, wherein the plurality of inductor cells comprises a first set of inductor cells coupled to a first output of the amplifier, and a second set of inductor cells coupled to a second output of the amplifier, the load circuit further comprises a first feedback capacitor having a first tunable capacitance and coupled between the first output of the amplifier and the second set of inductor cells, and a second feedback capacitor having a second tunable capacitance and coupled between the second output of the amplifier and the first set of inductor cells, and the controller is configured to tune the first and second capacitances of the first and second feedback capacitors, respectively, to tune the peaking gain.

5. The amplifier of claim 1, wherein each of the inductor cells is configured to mimic an impedance characteristic of an inductor coil.

6. The amplifier of claim 1, wherein the plurality of inductor cells comprising a first inductor cell, a second inductor cell having a smaller size than the first inductor cell, and a third inductor cell having a smaller size than the second inductor cell, and the controller is configured to set the peaking gain of the amplifier to a first peaking gain by enabling the first inductor cell, to set the peaking gain of the amplifier to a second peaking gain by enabling the first and second inductor cells, and to set the peaking gain of the amplifier to a third peaking gain by enabling the first, second and third inductor cells, the second peaking gain being greater than the first peaking gain, and the third peaking gain begin greater than the second peaking gain.

7. The amplifier of claim 6, wherein the first inductor cell comprises a first inductor transistor, the second inductor cell comprises a second inductor transistor, and the third inductor cell comprises a third inductor transistor, the second inductor transistor having a smaller gate width than the first inductor transistor, and the third inductor transistor having a smaller gate width than the second inductor transistor.

8. An amplifier, comprising:
a load circuit comprising a resistor and a plurality of inductor cells, wherein each of the inductor cells comprises:
an inductor transistor having a drain, a gate and a source, wherein the resistor is coupled between the gate and the drain of the inductor transistor; and
a first switch configured to selectively couple the source of the inductor transistor to a supply rail;
a drive circuit configured to receive an input signal, and to drive the load circuit based on the input signal to generate an amplified signal, wherein the drive circuit is coupled to the drain of the inductor transistor of each of the inductor cells; and
a controller configured to adjust a number of the inductor cells that are enabled to tune a peaking gain of the amplifier, wherein, for each of the inductor cells, the controller is configured to turn on the respective first switch to enable the inductor cell, and to turn off the respective first switch to disable the inductor cell.

9. The amplifier of claim 8, wherein each of the inductor cells comprises:
a diode-connected transistor having a drain, a gate and a source, wherein the gate and the drain of the diode-connected transistor are tied together, and the drain of the diode-connected transistor is coupled to the drive circuit; and
a second switch configured to selectively couple the source of the diode-connected transistor to the supply rail, wherein the controller is configured to turn off the second switch to enable the inductor cell, and to turn on the second switch to disable the inductor cell.

10. The amplifier of claim 8, wherein the resistor has a tunable resistance, and the controller is further configured to tune the resistance of the resistor to tune a frequency of the peaking gain.

11. The amplifier of claim 8, wherein the load circuit further comprises a capacitor having a tunable capacitance, the capacitor is coupled between the source and the gate of the inductor transistor in each of the inductor cells, and the controller is further configured to tune the capacitance of the capacitor to tune a frequency of the peaking gain.

12. The amplifier of claim 8, wherein the inductor transistor in each of the inductor cells comprises a p-type metal-oxide-semiconductor (PMOS) transistor.

13. A method for tuning a peaking gain of an amplifier, comprising:
receiving an input signal;
driving a load circuit of the amplifier based on the received input signal to generate an amplified signal, the load circuit comprising a plurality of inductor cells, wherein each of the inductor cells has an impedance that is higher at a first frequency than at a second frequency, the first frequency being higher than the second frequency; and
tuning the peaking gain of the amplifier by adjusting a number of the inductor cells that are enabled.

14. The method of claim 13, wherein the inductor cells are progressively sized, and tuning the peaking gain comprises increasing the peaking gain by enabling progressively smaller ones of the inductor cells.

15. The method of claim 13, wherein tuning the peaking gain is based on a peaking gain setting in a memory, the peaking gain setting corresponding to a number of the inductor cells to be enabled.

16. The method of claim 13, wherein the plurality of inductor cells comprises a first set of inductor cells coupled to a first output of the amplifier, and a second set of inductor cells coupled to a second output of the amplifier, the load circuit further comprises a first feedback capacitor having a first tunable capacitance and coupled between the first output of the amplifier and the second set of inductor cells, and a second feedback capacitor having a second tunable capacitance and coupled between the second output of the amplifier and the first set of inductor cells, and tuning the peaking gain further comprises tuning the first and second capacitances of the first and second feedback capacitors, respectively.

17. A method for tuning a peaking gain of an amplifier, comprising:
   receiving an input signal;
   driving a load circuit of the amplifier based on the received input signal to generate an amplified signal, the load circuit comprising a resistor and a plurality of inductor cells, wherein each of the inductor cells comprises an inductor transistor having a drain, a gate and a source, the resistor is coupled between the gate and the drain of the inductor transistor in each of the inductor cells; and
   tuning the peaking gain of the amplifier by adjusting a number of the inductor cells that are enabled, wherein tuning the peaking gain comprises enabling each one of the number of the inductor cells by coupling the source of the respective inductor transistor to a supply rail.

18. The method of claim 17, wherein the resistor has a tunable resistance, and the method further comprises tuning a frequency of the peaking gain by tuning the resistance of the resistor.

19. The method of claim 17, wherein the load circuit further comprises a capacitor having a tunable capacitance, the capacitor is coupled between the source and the gate of the inductor transistor in each of the inductor cells, and the method further comprises tuning a frequency of the peaking gain by tuning the capacitance of the capacitor.

20. An apparatus for tuning a peaking gain of an amplifier, comprising:
   means for receiving an input signal;
   means for driving a load circuit of the amplifier based on the received input signal to generate an amplified signal, the load circuit comprising a plurality of inductor cells, wherein each of the inductor cells has an impedance that is higher at a first frequency than at a second frequency, the first frequency being higher than the second frequency; and
   means for tuning the peaking gain of the amplifier by adjusting a number of the inductor cells that are enabled.

21. The apparatus of claim 20, wherein the inductor cells are progressively sized, and the means for tuning the peaking gain comprises means for increasing the peaking gain by enabling progressively smaller ones of the inductor cells.

22. The apparatus of claim 20, wherein the means for tuning the peaking gain comprises means for tuning the peaking gain based on a peaking gain setting in a memory, the peaking gain setting corresponding to a number of the inductor cells to be enabled.

23. An apparatus for tuning a peaking gain of an amplifier, comprising:
   means for receiving an input signal;
   means for driving a load circuit of the amplifier based on the received input signal to generate an amplified signal, the load circuit comprising a resistor and a plurality of inductor cells, wherein each of the inductor cells comprises an inductor transistor having a drain, a gate and a source, the resistor is coupled between the gate and the drain of the inductor transistor in each of the inductor cells; and
   means for tuning the peaking gain of the amplifier by adjusting a number of the inductor cells that are enabled, wherein the means for tuning the peaking gain comprises means for enabling each one of the number of the inductor cells by coupling the source of the respective inductor transistor to a supply rail.

24. The apparatus of claim 23, wherein the resistor has a tunable resistance, and the apparatus further comprises means for tuning a frequency of the peaking gain by tuning the resistance of the resistor.

25. The apparatus of claim 23, wherein the load circuit further comprises a capacitor having a tunable capacitance, the capacitor is coupled between the source and the gate of the inductor transistor in each of the inductor cells, and the apparatus further comprises means for tuning a frequency of the peaking gain by tuning the capacitance of the capacitor.

26. The apparatus of claim 20, wherein the plurality of inductor cells comprises a first set of inductor cells coupled to a first output of the amplifier, and a second set of inductor cells coupled to a second output of the amplifier, the load circuit further comprises a first feedback capacitor having a first tunable capacitance and coupled between the first output of the amplifier and the second set of inductor cells, and a second feedback capacitor having a second tunable capacitance and coupled between the second output of the amplifier and the first set of inductor cells, and the means for tuning the peaking gain further comprises means for tuning the first and second capacitances of the first and second feedback capacitors, respectively.

* * * * *